(12) United States Patent
Gelsomini

(10) Patent No.: US 6,456,554 B1
(45) Date of Patent: Sep. 24, 2002

(54) CHIP IDENTIFIER AND METHOD OF FABRICATION

(75) Inventor: Tito Gelsomini, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 20 days.

(21) Appl. No.: 09/686,455

(22) Filed: Oct. 11, 2000

Related U.S. Application Data

(60) Provisional application No. 60/160,409, filed on Oct. 19, 1999.

(51) Int. Cl.$^7$ ................................................. G11C 7/00
(52) U.S. Cl. ............. 365/226; 365/189.01; 365/189.12
(58) Field of Search ........................... 365/226, 189.01, 365/189.12

(56) References Cited

U.S. PATENT DOCUMENTS

| | | | |
|---|---|---|---|
| 4,590,589 A | * 5/1986 | Gerzberg | ..................... 257/52 |
| 5,337,281 A | * 8/1994 | Kobayashi et al. | .... 365/185.13 |
| 5,406,524 A | * 4/1995 | Kawamura et al. | ...... 365/185.1 |
| 5,799,080 A | * 8/1998 | Padmanabhan et al. | ..... 365/103 |
| 5,844,298 A | * 12/1998 | Smith et al. | .................. 257/50 |

* cited by examiner

*Primary Examiner*—Richard Elms
*Assistant Examiner*—Tuan T. Nguyen
(74) *Attorney, Agent, or Firm*—Godwin Gruber, P.C.; Gary C. Honeycutt

(57) ABSTRACT

An integrated circuit chip comprising an integrated circuit made in a semiconductor substrate, an information write-register circuit having a plurality of gate-controlled components, such as MOS transistors or capacitors, said write-register being integrated into said circuit yet individually addressable; said components having a gate insulator geometry locally susceptible to electrical conductivity upon applying overstress voltage pulses between said gates and said substrate, whereby information can be permanently encoded into said write-register; and a plurality of level shifter circuits to supply said pulses selectively to said component gates according to stored data and controlled by enable commands, said level shifters being integrated into said circuit.

11 Claims, 3 Drawing Sheets

CHIP IDENTIFIER AND METHOD OF FABRICATION

This application claims benefit of provisional application 60/160,409 filed Oct. 19, 1999.

BACKGROUND OF THE INVENTION

The present invention is related in general to the field of semiconductor devices and processes and more specifically to integrated circuits structure, fabrication and operation as they relate to data storage an chip identification.

DECRIPTION OF THE RELATED ART

Cutting through a thin film of metal or doped polycrystalline semiconductor by laser pulses has been practiced for many years as a method of irreversibly opening electrical fuses. A well-known example is the repair of memory integrated circuits (IC) based on available redundant building blocks. Another example, the reading of electrical data stored in an information unit associated with ICs, is described in U.S. patent application Ser. No. 60/094,097, filed on Jul. 24, 1998 (Gelsomini et al., "Integrated Circuit Wireless Tagging").

The method, however, of opening metal fuses by laser pulses is expensive. It requires extra process steps and expensive laser equipment in device fabrication. Furthermore, the silicon real estate needed for the layout of the metal fuses is substantial. Most important, opening fuses by laser pulses is very expensive for writing information. The semiconductor industry has, therefore, considered the approach of anti-fuses. It is a circuit element that is normally open circuited until it is programmed, at which point the anti-fuse assumes a relatively low resistance. Anti-fuses are commonly used to selectively enable certain features of ICs and to perform repairs by replacing defective portions with redundant circuits.

Conventional anti-fuses are similar in construction to capacitors; they have a pair of conductive plates separated from each other by a dielectric such as oxide or nitride. The dielectric is changed into a conductive regime by applying a differential voltage between the plates that is sufficient to break down the dielectric, thereby allowing for electrical connection between the plates. Typically this high programming voltage is applied to the IC externally. It is a disadvantage of anti-fuses that the programmed resistance may vary over a considerable range and is often far higher than desired. Further, the magnitude of the programming voltage that can be applied to the anti-fuses is severely limited by the presence of other circuitry.

An example for using anti-fuses is given in U.S. Pat. No. 4,590,589, issued on May 20, 1986 (Gerzberg, "Electrically Programmable Read-only Memory"). The antifuse described is normally nonconductive until a sufficient voltage is applied across the anti-fuse to lower the resistance thereof and become conductive. The anti-fuse can comprise a portion of an n-type silicon substrate with an implanted region formed in a surface region by the introduction of p-type ions. The implanted ions disrupt the crystalline structure of the substrate and the disrupted crystalline structure increases the resistance between the implanted region and the substrate. By applying a sufficient voltage across the implanted region, the crystalline state of the region is reinstated and the resistance thereof drops appreciably. After removing the voltage, the disrupted state is restored only partially or insufficiently for a repeat operation.

The anti-fuse as described above has been applied in U.S. Pat. No. 5,799,080, issued on Aug. 25, 1998 (Padmanabhan et al., "Semiconductor Chip Having Identification/Encryption Code") to provide a code mechanism in an IC for identifying the IC or for enabling the IC. However, the code is readily accessible for interrogation and enablement only once. Alternatively, the code can be reprogrammed by use of an electrically erasable field effect transistor.

U.S. Pat. No. 5,844,298, issued on Dec. 1, 1998 (Smith et al., "Method and Apparatus for Programming Anti-Fuses") describes a programming circuit for anti-fuses fabricated in the same IC. Relatively large (positive) programming voltages are applied from the outside so that relatively elaborate circuitry is needed to protect gate oxide layers in MOSFETs of the IC from damage.

An urgent need has therefore arisen to conceive a concept for a low-cost, yet high performance method of encoding anti-fuses in ICs to allow chip identification. Preferably, this method should be based on fundamental design concepts flexible enough to be applied for different semiconductor product families and a wide spectrum of design and assembly variations. No extra process steps should be required. The method should not only meet high electrical and information performance requirements, but should also achieve improvements towards the goals of enhanced process yields and device reliability. Preferably, these innovations should be accomplished using the installed equipment base so that no investment in new manufacturing machines is needed.

SUMMARY OF THE INVENTION

According to the present invention, an information write-register embedded in an integrated circuit is made of a plurality of gate-controlled MOS transistors or capacitors having a gate insulator geometry locally susceptible to electrical conductivity upon applying overstress voltage pulses, whereby information can be permanently encoded into the write-register. In order to supply the pulses selectively to the component gates, a plurality of level shifters, also embedded in the integrated circuit, outputs the pulses on the basis of inputs received from stored data and enable commands.

The present invention is related to semiconductor integrated circuits (ICs) of any kind, especially those having high density and high value. These ICs can be found in many semiconductor device families such as processors, digital and analog devices, memory and logic devices, high frequency and high power devices, specifically in large area chip categories. The invention offers an inexpensive way to permanently write into, and store, a coded individual identification as well as manufacturing and engineering data. Examples include wafer lot number, wafer number, chip location on the wafer, test results, electrical and functional characteristics, and so on. The writing can be performed at the wafer level, or after packaging of the unit.

It is an aspect of the invention to offer desirable features to both the manufacturer and the user at no extra cost:

Data writing and reading: Individual wafer level engineering data can be stored and then retrieved at any time, even after chip assembly and packaging. Parametric and functional performance data measured at wafer level can be compared to final test data after assembly—a necessity in manufacturing science for cost-conscious process development.

Anti-theft coding: Permanently recording the producer, date of production, country of origin, user ID, is a significant crime deterrent.

ISO 9000 requirements: Permanent chip identification is desired in qualification.

Military requirements: Permanent identification of manufacturer and country of origin.

User's data: Inputs for personal interest of the user.

Another aspect of the invention is to require no extra process steps and no extra equipment, and also to operate at high speed so that no extra cost is added to the manufacturing.

Another aspect of the invention is to be conservative with real estate requirements, especially to require not more silicon area for the MOS transistors to be programmed than for standard metal fuses.

Another aspect of the invention is to provide reading of the information by sensing (with the use of sense amplifiers) the electrical status of the MOS transistors and loading their logic content into a shift register. The different electrical characteristics of the MOS transistors which have been programmed can be detected by sensing the voltage of a specific line of the information write-register.

Another aspect of the invention is to provide means for identifying and handling redundancy of rows or columns, and for selecting certain circuit portions over others (so-called "trimming"). This capability is based on the fact that the electrical status of MOS transistor insulators is equivalent to the electrical status of conventional metal or polysilicon fuses.

Another aspect of the present invention is to design the information write-register so that he information can be encoded in a data bank while the chip is still in wafer form, as well as after its singulation. This aspect is achieved by providing a plurality of electrical anti-fuses in the data bank, which can be irreversibly transformed into the conductive state by applying overstress voltage pulses.

Another aspect of the invention is to design the information write-register, level shifters, write-control logic, and read-control logic such that their fabrication is flexible and can be adopted to the most commonly used and accepted IC fabrication processes.

These aspects have been achieved by the teachings of the invention concerning design concepts and process flows suitable for mass production. Various modifications have been successfully employed to satisfy different selections of product design and processes.

In the first embodiment of the invention, the circuit of a chip identifier module is described, consisting of write-control and write-control logic including information register, and read-control and read-control logic. MOS transistors are used having gate insulators made of silicon dioxide in a thickness range from about 5 to 10 nm. These oxides can be locally transformed into the conductive state by pulses in the range from 6 to 10 V and 10 to 50 $\mu$s duration.

In a variation of this embodiment, field transistors are used having the field oxide similar to the gate oxide in the MOS transistor embodiment.

In another variation, capacitors are used having electrically conductive terminals and an intermediate insulating layer of characteristics similar to the MOS gate oxides in the MOS transistor embodiment.

In the second embodiment of the invention, the circuit of a redundancy or trimming module is described, consisting of write-control and write-control logic, and rows/columns redundancy logic, or trimming logic.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
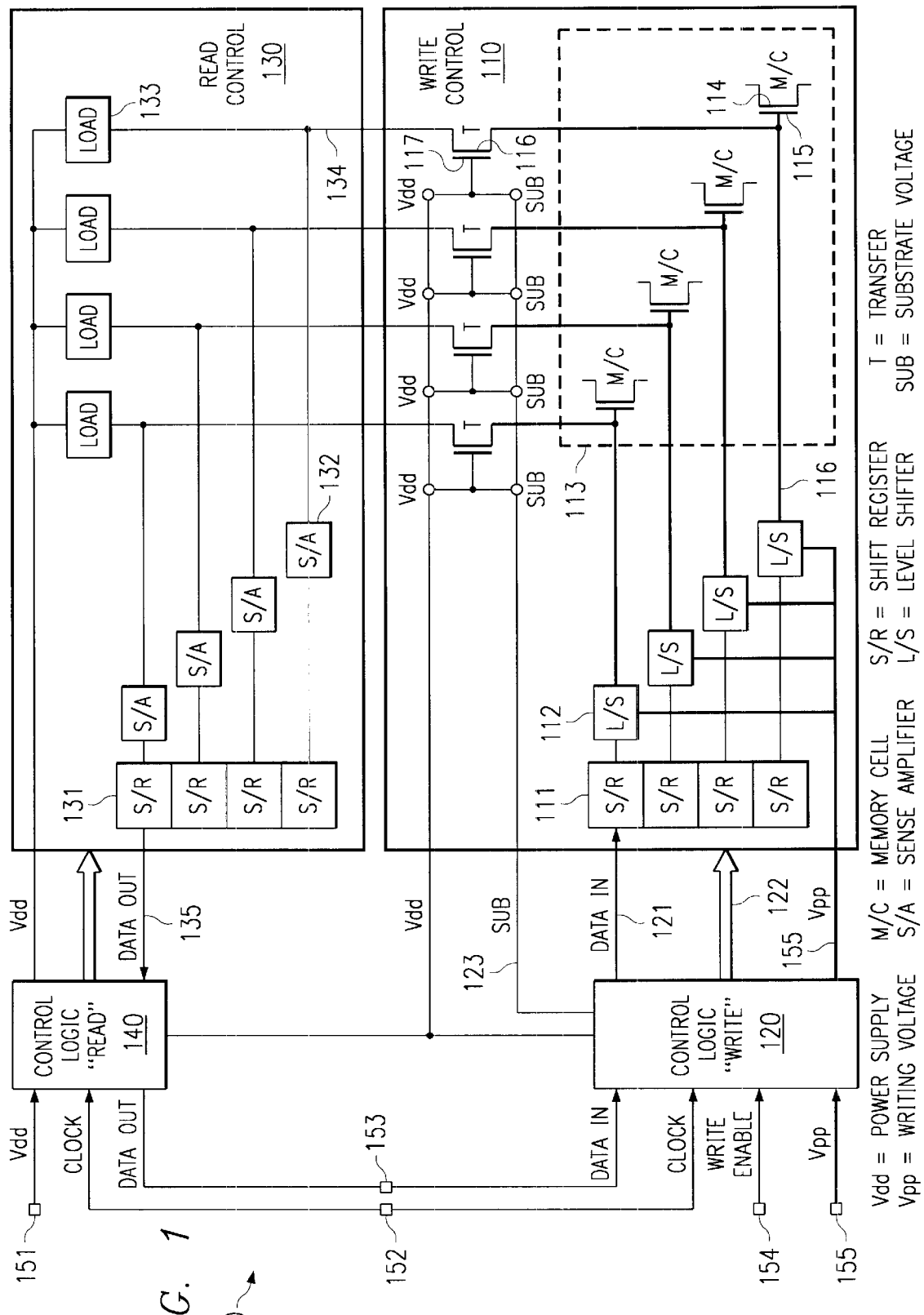
FIG. 1 is a schematic block diagram of the first embodiment of the invention, the integrated circuit chip identifier module including the write-control with information write-register, and read control.

The main concept of the first embodiment of the invention is shown in FIG. 1. It is a schematic block diagram of the chip identifier module, generally designated 100. The major units of module 100 are the write-control unit 110, which is under the direction of the write-control logic unit 120; the read-control unit 130, which is under the direction of read-control unit 140; and a plurality of input/output pads. Included in these pads are the power supply voltage 151, commonly referred to as Vdd; the clock signals 152; the pad 153 for data in and data out; the write-enable pad 154; and the writing voltage 155, commonly referred to as Vpp. Vpp is preferably in the 6 to 10 V range and provides the overstress voltage pulses to be used for information encoding.

As long as Vdd is supplied to write-control logic unit 120, the input data 153 can pass the write-control logic and proceed to shift register 111 as "Data In" (121 in FIG. 1). This information is synchronized by the clock in 122 and stored as a code in shift register cells 111, forming a sequence of "logic 0" and "logic 1".

Figure 4:
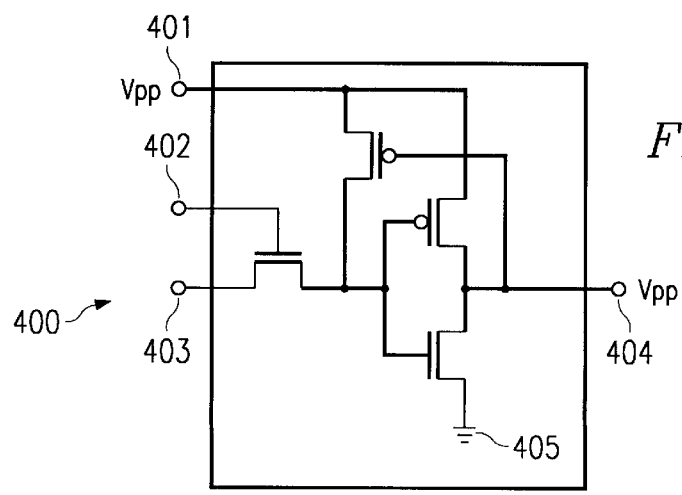
FIG. 4 is a schematic block diagram of the level shifter as part of the write-control of the invention.

Each shift register cell 111 is electrically connected to a level shifter 112 (shown in more detail in FIG. 4). Further connected to the level shifters 112 are traces 155 with the writing voltage Vpp. In FIG. 1, these traces are drawn as heavy lines since they carry relatively high voltage. For successful fabrication of the chip identifier module, all transistors, insulators and other electrical parts in conjunction with Vpp, need to be able to sustain voltages up to about 10V (or even 12 V) without undergoing changes due to this electrical stress. If the specific technology used for fabricating the chip identifier module would have parts at risk at the high voltage, by way of example, field transistors have to be employed instead of standard transistors.

Of pivotal importance to the present invention is the information write-register 113. It provides a plurality of memory cells 114 or other gate-controlled components, which are integrated into write-control unit 110 and thus the overall IC, yet individually addressable (more detail in FIGS. 2 and 3). In particular, the gates 115 are connected to the outputs 116 of the level shifter cells 112, which supply the overstress voltage pulses (heavy lines in FIG. 1) to the gates 115 for information encoding.

The method for encoding the information write-register 113, which contains the plurality of memory cells 114 including insulators controlled by gates 115, comprises the steps of:

Applying pulses of overstress voltage Vpp (about 6 to 10 V) gates 115. The duration of these pulses is preferably in range from about 10 to 50 μs. Pulses of this strength are sufficient to invert locally the insulating character of the gate insulator to an electrically conductive character.

Controlling these pulses as the outputs from level shifters 112 in accordance with the data stored in shift registers 111 and the enable commands from the write-control logic unit 120.

The method of controlling the overstress pulses is executed by the level shifters 112. As shown in more detail in FIG. 4, a level shifter, generally designated 400, has three essential input terminals:

Terminal 401 supplies writing (overstress) voltage Vpp, indicated in FIG. 4 by heavy connecting lines.

Terminal 402 supplies the "write enable" command from the write-control logic (120 in FIG. 1).

Terminal 403 supplies the data from the respective shift register (111 in FIG. 1), assigned to the specific level shifter.

The level shifter has output terminal 404, which connects Vpp to the memory cell (114 in FIG. 1), and further connection to ground 405. The method of controlling the overstress pulses comprises the steps of:

activating Vpp at terminal 401;
accepting write-enable commends at terminal 402;
accepting instructions at terminal 403 by the data stored in the respective shift register;
outputting Vpp pulses or ground potential, respectively, at terminal 404 as a function of the content of the respective shift register 111.

If the level shifter output is Vpp, the corresponding memory cell gate 115 is at Vpp. Energy and time of this pulse are sufficient to invert locally the insulating character of the gate insulator to an electrically conductive character, creating an electrical path from gate 115 to substrate ("logic 0"). (Transfers 116 are used to isolate read control unit 130 when Vpp is applied.)

If the level shifter output is ground, the corresponding memory cell gate 115 is at ground. The gate oxide will not be affected and gate 115 remains isolated from substrate ("logic 1").

Referring now to FIG. 1, the sequence of the "write" function is as follows.

Vdd is applied, powering the write-control logic unit 120. Gates 117 of the transfer transistors are at substrate voltage (ground).

Write enable command is applied:
Write control unit 110 is powered, but in stand-by mode;
Clock 152 is applied; the "write" function starts.
Shift register 113 of write control unit 110 is activated.
Data start flowing from pad 153 loading the shift register cells 111.
Writing voltage Vpp is applied.
Write-control logic 120 applies Vpp to level shifters 112. The output of each level shifter is a function Of the content of the respective shift register 111, as described above in conjunction with FIG. 4.
Transfer transistors 116 isolate the high voltage Vpp from the read control unit 130. The isolation is effective when gates 117 of the transfer transistors are at substrate voltage 123; the "read" function is activated when gates 117 are at power supply voltage Vdd.

The purpose of the "read" function is to sense the electrical status of each individual memory cell 114 in the write-register 110 and to load the logic content of the memory cells into the shift register cells 131 of the read control unit 130. After completion of the "read" function, the content of the shift register cells 131 of the read-control unit should match with the content of the shift register cells 111 of the write-control unit, which was loaded with the Data In 121 at the beginning of the "write" function. Sense amplifiers 132 are connected.

The sequence of the "read" function is as follows.
Power supply voltage Vdd is applied; using load resistors 133, transfer gates 117 are set at Vdd.
Clock 152 is applied; the "read" function starts.
Sense amplifiers 132 transfer to their respective shift registers 131 the status being sensed:
Vdd, corresponding to "logic 1", if the line 134 from load 133 to memory cell gate 115 is isolated from the substrate;
ground, corresponding to "logic 0", if the line 134 from load 133 to memory cell gate 115 is shorted to substrate.
Content of shift register 131 will flow as Data Out (135 in FIG. 1) to the read-control logic 140 to the input/output pad 153.

Figure 2:
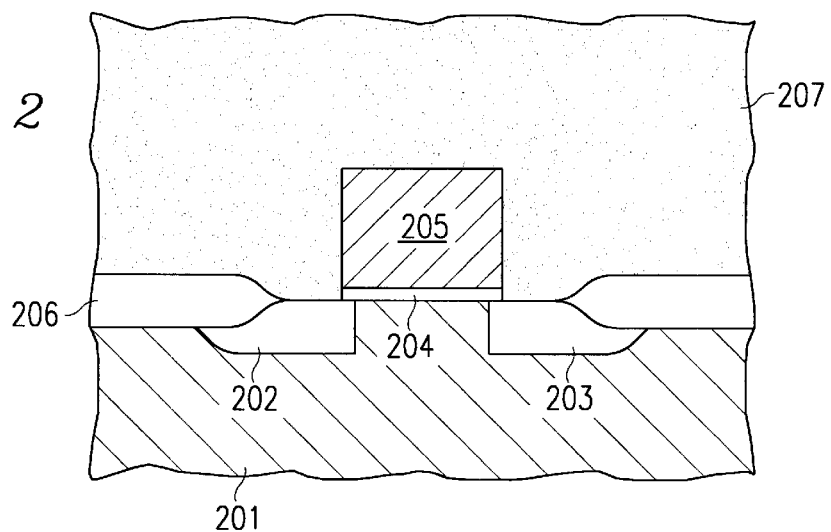
FIG. 2 is a schematic and simplified cross section of a MOS transistor used in the write-register of the write-control.

FIG. 2 illustrates schematically a memory cell of the information write-register in the form of an MOS transistor acting as an anti-fuse. In substrate 201 (typically silicon or silicon germanium), source 202 and drain 203 are formed by doping (ion implantation and diffusion). Gate oxide 204 is formed by silicon dioxide in the preferred thickness range from about 5 to 10 nm. Gate 205 is the controlling element of the transistor (designated 115 in FIG. 1). Reference number 206 indicates isolation oxides, and reference number 207 indicates passivation regions.

If gate 205 is connected to writing voltage vpp for an overstress pulse of preferably 6 to 10 V height and 10 to 50 μs duration, gate oxide 204 is permanently damaged in at least one location, creating an electrically conductive path from gate 205 to substrate 201. This act represents the "writing" of the information. As a consequence, the respective load transistor of the read control unit has an electrically conductive path to the substrate; otherwise, this path does not exist. This fact represents the "reading" of the information.

Figure 3:
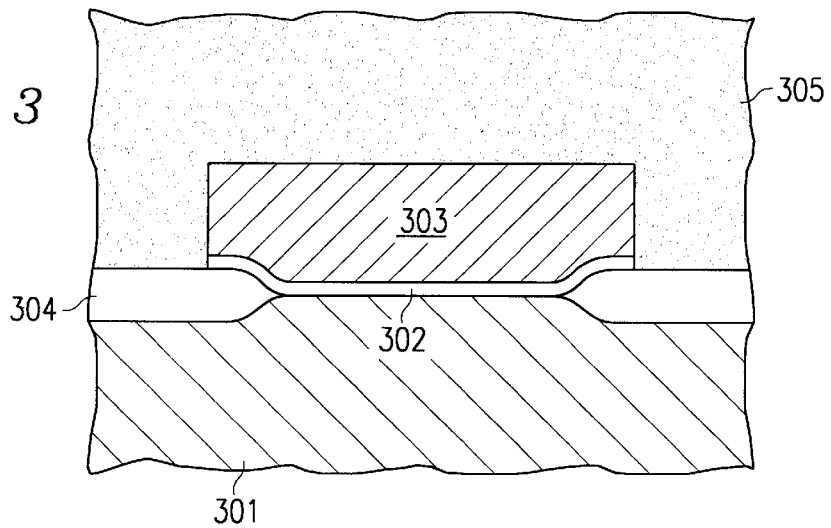
FIG. 3 is a schematic and simplified cross section of a capacitor used in the write-register of the writecontrol.

FIG. 3 illustrates schematically a memory cell of the information write-register in the form of a capacitor acting as an anti-fuse. On the surface of substrate 301, gate oxide 302 is formed by silicon dioxide in the preferred thickness range from about 5 to 10 nm. Gate 303 is the controlling element of the capacitor. Reference number 304 indicates isolation oxides, and reference number 305 indicates passivation regions. The processes of writing and reading are analogous to the processes of the MOS transistor described in FIG. 2.

Figure 5:
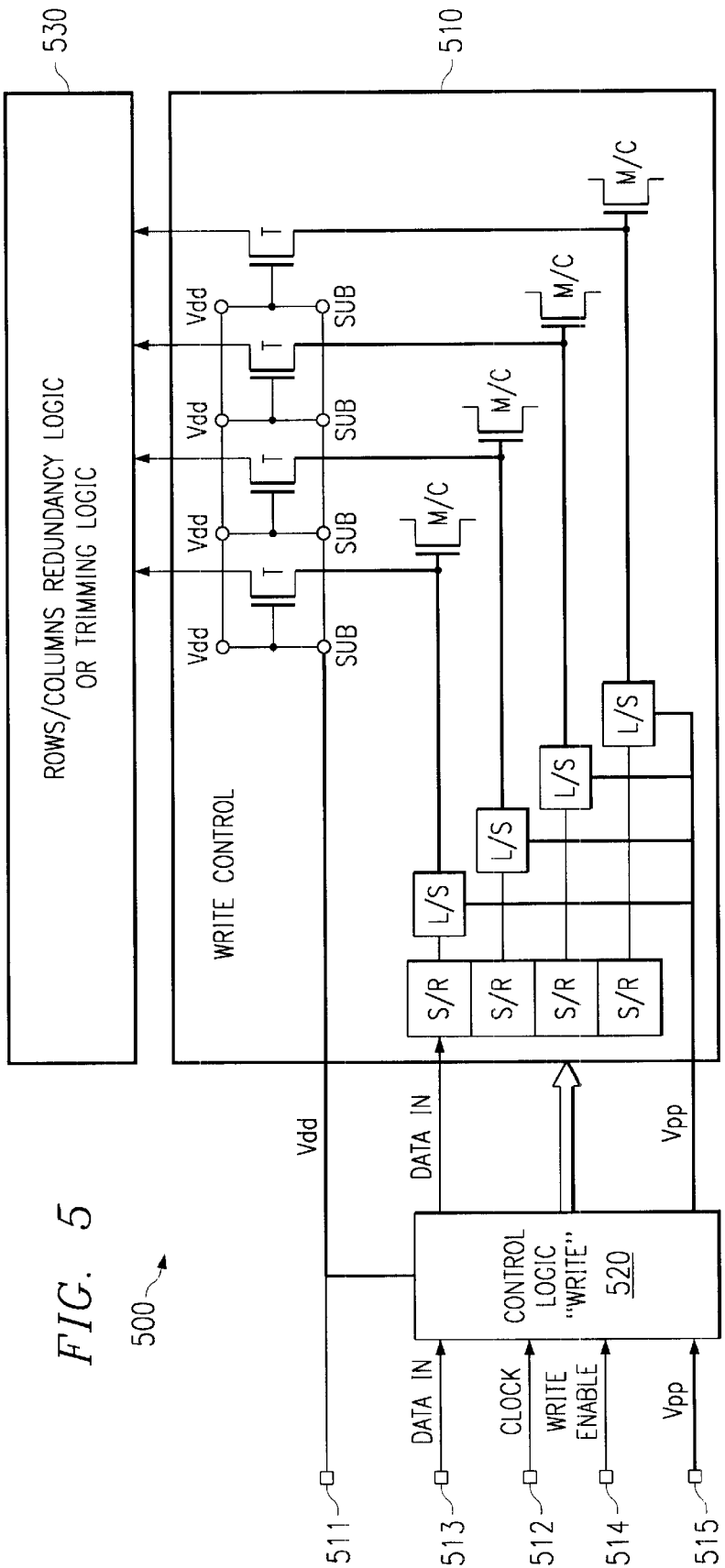
FIG. 5 is a schematic block diagram of the second embodiment of the invention, the integrated circuit redundancy and trimming module.

The concept of the second embodiment of the invention is shown in FIG. 5. It represents the schematic block diagram of a redundancy or "trimming" module, which is needed in many semiconductor device applications. It is generally designated 500. The major units of the module are the write-control unit 510, which is under the direction of the write-control logic unit 520. Both units are constructed and operational analogous to the respective units in FIG. 1. FIG. 5 further shows rows/columns redundancy logic, or, alternatively, trimming logic, 530, as well as a plurality of input/output pads. Included in these pads are the power supply voltage 511, commonly referred to as Vdd; the clock signals 512; the pad 513 for data in; the write-enable pad 514; and the writing voltage 515, commonly referred to as Vpp. Vpp is preferably in the 6 to 10 V range and provides the overstress voltage pulses to be used for the redundancy or trimming operations.

The write-control unit 510 is designed according to the rules specific for the device type to be served, and it is fabricated according to the technology employed by that device type.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, the gate oxide to be exposed to overstress voltage pulses may be constructed of silicon dioxide, silicon oxynitride, HSQ or organic insulator materials, and the thicknesses may be selected according to the chosen dielectric material. It is therefore intended that the appended claims encompass any such modifications or embodiments.

I claim:

1. An integrated circuit chip comprising:
   an integrated circuit made in a semiconductor substrate;
   an information write-register circuit having a plurality of gate-controlled components, said write-register being integrated into said circuit chip yet individually addressable;
   said components having a gate insulator geometry locally susceptible to electrical conductivity upon applying overstress voltage pulses between said components and said substrate, whereby information can be permanently encoded into said write-register; and
   a plurality of level shifter circuits to supply said pulses selectively to said component gates according to stored data and controlled by enable commands, said level shifters being integrated into said chip.

2. The integrated circuit according to claim 1 wherein said gate-controlled components are MOS transistors having source-gate-drain configurations.

3. The integrated circuit according to claim 1 wherein each of said gate-controlled components is a capacitor having electrically conductive terminals and an intermediate insulator layer.

4. The integrated circuit according to claim 1 wherein said gate insulator is silicon dioxide in the thickness range from about 5 to 10 nm.

5. The integrated circuit according to claim 1 wherein each of said overstress voltage pulses is in the range from 6 to 10 V and has a pulse duration from 10 to 50 $\mu$s.

6. The integrated circuit according to claim 1 wherein said encoded information includes data about identification, fabrication, characterization, design and performance of said integrated circuit, or any other form of data.

7. The integrated circuit according to claim 1 further having transistors arranged in an information read-register circuit operable to read information encoded in said write-register.

8. A method for encoding an information write-register of an integrated circuit, having a plurality of components including gate-controlled insulators, each of said components coupled to a level shifter integrated into said circuit, comprising the steps of:
   applying overstress voltage pulses to said gate-controlled insulators thereby locally inverting the insulating character of said gate controlled insulators and permanently encoding information into said write-register; and
   controlling said pulses as outputs from said level shifters according to stored data and enable commands used as inputs to said level shifters.

9. The method according to claim 8 wherein the step of controlling said pulses by the circuitry of said level shifters includes the steps of:
   activating said overstress voltage pulses as input to said level shifters;
   accepting write-enable commands as inputs to said level shifters;
   accepting instructions by data stored in shift registers as inputs to said level shifters; and
   outputting said pulses from said level shifters to said components whenever said level shifters create an output pulse from said inputs.

10. The method according to claim 8 wherein locally inverting the insulating character of controlled said gate-insulators by said overstress voltage pulse encode a "logic 0" in said components.

11. The method according to claim 8 wherein said inverting of said insulating character of said gate-controlled insulators encodes a "logic 1" in said components.

* * * * *